(12) United States Patent
Lee (10) Patent No.: US 7,348,768 B2
(45) Date of Patent: Mar. 25, 2008

(54) TRAY TRANSFER UNIT AND AUTOMATIC TEST HANDLER HAVING THE SAME

(75) Inventor: Eun-Soo Lee, Cheonan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 378 days.

(21) Appl. No.: 10/736,833

(22) Filed: Dec. 17, 2003

(65) Prior Publication Data

US 2004/0259402 A1 Dec. 23, 2004

(30) Foreign Application Priority Data

Jun. 5, 2003 (KR) ...................... 10-2003-0036411

(51) Int. Cl.
*G01R 31/28* (2006.01)
(52) U.S. Cl. .................................... 324/158.1
(58) Field of Classification Search ............... None
See application file for complete search history.

(56) References Cited

U.S. PATENT DOCUMENTS

| | | | | |
|---|---|---|---|---|
| 4,926,118 A | * | 5/1990 | O'Connor et al. | 324/760 |
| 5,307,011 A | * | 4/1994 | Tani | 324/158.1 |
| 5,313,156 A | * | 5/1994 | Klug et al. | 324/158.1 |
| 5,319,353 A | * | 6/1994 | Ohnishi et al. | 340/525 |
| 5,742,168 A | * | 4/1998 | Kiyokawa et al. | 324/754 |
| 5,772,387 A | * | 6/1998 | Nakamura et al. | 414/416.01 |
| 5,788,084 A | * | 8/1998 | Onishi et al. | 324/158.1 |
| 5,862,158 A | | 1/1999 | Baylor et al. | |
| 5,909,657 A | * | 6/1999 | Onishi et al. | 702/108 |
| 6,066,822 A | * | 5/2000 | Nemoto et al. | 209/573 |
| 6,198,273 B1 | * | 3/2001 | Onishi et al. | 324/754 |
| 6,384,593 B1 | * | 5/2002 | Kobayashi et al. | 324/765 |
| 6,433,294 B1 | * | 8/2002 | Nemoto et al. | 209/573 |
| 6,515,470 B2 | * | 2/2003 | Suzuki et al. | 324/754 |
| 2002/0036161 A1 | | 3/2002 | Nemoto et al. | |

FOREIGN PATENT DOCUMENTS

| | | |
|---|---|---|
| JP | 2002168907 | 6/2002 |
| KR | 1019980155612 | 7/1998 |
| KR | 1998-044541 | 9/1998 |
| KR | 1999-60680 | 7/1999 |
| KR | 1020000027302 | 5/2000 |
| KR | 1020010081820 | 8/2001 |

* cited by examiner

*Primary Examiner*—Jermele Hollington
(74) *Attorney, Agent, or Firm*—Harness, Dickey & Pierce, P.L.C.

(57) ABSTRACT

Provided is a tray transfer apparatus having a transfer plate arranged and configured to support a tray containing a number of semiconductor devices in an array of pockets. The tray transfer apparatus further includes a driving means arranged and configured for the movement and positioning of the transfer plate. The transfer plate is provided with a plurality of tray holders that may be selectively engaged to support a tray and with detecting means corresponding to the array of pockets provided in a supported tray. In instances in which one or more of the detecting means sense the presence of more than one semiconductor device in a corresponding pocket of a supported tray, the tray transfer apparatus will generate an alarm signal and/or suspend operation so that corrective measures may be taken.

13 Claims, 12 Drawing Sheets

TRAY TRANSFER UNIT AND AUTOMATIC TEST HANDLER HAVING THE SAME

CROSS REFERENCE TO RELATED APPLICATIONS

This U.S. non-provisional application claims priority under 35 U.S.C. § 119 to Korean Patent Application No. 2003-36411 filed Jun. 5, 2003, the contents of which are incorporated herein, in its entirety, by reference.

BACKGROUND OF THE INVENTION

1. Field of the Invention

The present invention relates to a semiconductor manufacturing apparatus and, in particular, to an improved tray transfer unit and an automatic test handler including such a tray transfer unit.

2. Description of the Related Art

After being sawed from a wafer, semiconductor devices are typically placed in trays during certain points during their manufacture to reduce the likelihood of damage and to increase the ease with which the semiconductor devices may be handled. The semiconductor devices are typically removed from a tray for processing and discharged to the same or a different tray after processing in a manner that maintains the order in which they are arranged in the original tray. The semiconductor devices are also typically transferred between processing equipment as they are arranged in a tray.

The semiconductor devices are typically transferred between processing equipment by an operator, and are then transferred within the processing equipment using a tray transfer unit. The tray transfer unit is installed in a loading part or an unloading part of the processing equipment to load or unload the trays containing the semiconductor devices. The tray transfer unit may be incorporated in an automatic test handler used in a test process so that trays containing the semiconductor devices to be tested can be loaded and those devices that have been tested can be unloaded automatically. A conventional automatic test handler with a tray transfer unit is described below.

Figure 1:
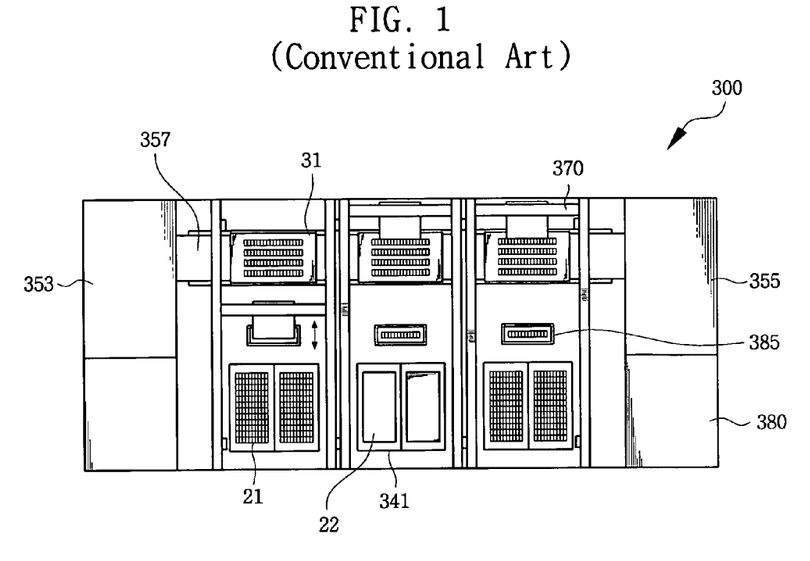
FIG. 1 is a plan view of a conventional automatic test handler.
Figure 2:
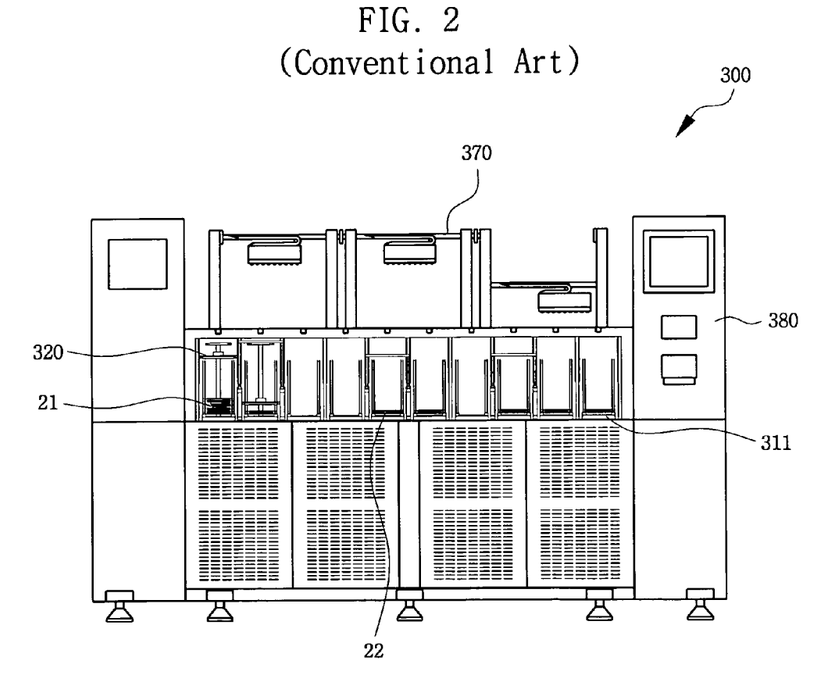
FIG. 2 is a front view of the conventional automatic test handler.

FIG. 1 is a plan view of a conventional automatic test handler. FIG. 2 is a front view of the conventional automatic test handler. As illustrated in FIGS. 1 and 2, the conventional automatic test handler 300 comprises a tester (not shown) for testing the semiconductor devices, a first chamber 353 for establishing the temperature condition for test typically by heating or cooling the semiconductor devices to one or more temperatures as much as 50° C. or more above or below room temperature, a second chamber 355 for restoring the tested semiconductor devices to a temperature much closer to room temperature and a pick and place device 370 for transferring the semiconductor devices. The conventional automatic test handler 300 further comprises a plurality of tray stockers 311 having supply trays 21 and receiving trays 22, a tray transfer unit 320 for transferring the supply tray 21, grippers 341 for supporting the supply trays 21 and a control unit 380 for controlling the overall operation.

The loaded supply trays 21 containing a number of semiconductor devices are loaded in the tray stocker 311. A supply tray 21 is then transferred to the gripper 341 by the tray transfer unit 320. The semiconductor devices in the supply tray 21 may then be temporarily placed in a buffer 385 and finally placed onto a test tray 31 provided on a conveyor belt 357 by the pick and place device 370. The test tray 31 is moved into the first chamber 353 to establish the test temperature(s) for the semiconductor devices in the test tray 31. The test tray 31 is then transferred to the tester in which semiconductor devices in the test tray 31 are determined to pass or fail predetermined functional and/or parametric test processes.

After the test process is completed, the test tray 31 having the tested semiconductor devices is transferred to the second chamber 355 where the tested semiconductor devices are typically restored to a normal temperature of about 25° C. The semiconductor devices are then transferred by the pick and place device 370 through the buffer 385 and returned to open pockets on a supply tray 21 or a receiving tray 22 supported by a gripper 341 and may be sorted according to the test results. The trays, once loaded with tested and sorted semiconductor devices, are then transferred to the tray stocker 311 for unloading.

The conventional automatic test handler may automatically load or unload the semiconductor devices, thereby reducing the test time and eliminating the need for additional operator involvement, which may lead to increased productivity. The conventional automatic test handler, however, has disadvantages. For example, a so-called double device fault may occur during the test process. A double device fault refers to a fault where two or more semiconductor devices are placed in a single pocket or receptacle of the tray. A double device fault may result from the malfunction of an adsorption component, e.g., a vacuum adsorptive pad or a vacuum pump, or from the malfunction of a component used to detect the adsorption of the semiconductor device, e.g., a sensor.

If such a fault is caused by the malfunction of a component related to vacuum, it may be that a vacuum adsorptive force was not properly applied through the vacuum adsorptive pad or was improperly released. In such instances, the semiconductor device may not be adsorbed for loading or unloading, or may be released prematurely during transfer.

If the fault is caused by the malfunction of a component used to detect the adsorption, the adsorption of the semiconductor device by the vacuum adsorptive pad may not be detected accurately and may generate erroneous loading data. Errors in loading data may be transmitted to the control unit of the automatic test handler. As a result of the erroneous data, the control unit may attempt to load another semiconductor device in a pocket already containing a semiconductor device that has not been properly recognized or acknowledged by the control unit.

In order to prevent a double device fault, the components related to vacuum adsorption or detection of adsorption should be replaced or repaired before the durability of the components is exceeded either as a result of forced or natural deterioration or through faults generated by other causes. However, the durability of the components is affected by the environment, rendering it difficult to measure or estimate the durability of the component with sufficient accuracy to ensure that corrective maintenance is performed in a timely manner. Further, if faults are the result of causes other than exceeding component durability, the repair or replacement of such components may not be required.

For the above reasons, it has proven difficult to eliminate double device faults completely thereby making it necessary to detect a double device fault when it occurs so that corrective action may be taken.

SUMMARY OF THE INVENTION

The present invention is directed to an improved tray transfer unit, and an automatic test handler including such a tray transfer unit, which may detect double device faults in a manner that reduces product damage resulting from such faults.

A tray transfer unit comprises a transfer plate having tray holders. The tray holder supports the tray. Detecting means corresponding to each pocket of the tray are located and operated to detect a stack of semiconductor devices in a pocket. A detecting substrate comprises circuit wires and an input/output terminal. The circuit wires electrically connect the detecting means in parallel with the input/output terminal being connected to the circuit wires.

When a stack of at least two semiconductor devices are detected in a particular pocket of the tray, the detecting means will generate output signals from the detecting substrate through the input/output terminals. The output signals may activate one or more warning signals such as a flashing lamp or buzzer to alert an operator and/or may stop the operation of equipment so that corrective measures may be taken.

The detecting means may include a detecting switch such as a push-button switch having a mechanical contact mode. Push-button switches offer the advantages of a simple structure, easy installation, excellent durability and competitive price. The push-button switches may be mounted on the transfer plate so that a portion of the switch protrudes from the bottom of the transfer plate. The push-button switches may preferably perform a switching operation by pushing the button without changing the thickness of the transfer plate.

The detecting means may be fixed to the detecting substrate by soldering or may be configured to allow the detecting means to be easily detached from or connected to the detecting substrate. The tray holder comprises rotation axes located at the edges of the transfer plate, a catch finger rotatably connected to the rotation axis and a driving cylinder permitting application of rotation force to the catch finger. The detecting substrate may further comprise a connector connected to the input/output terminal.

The tray transfer unit may further comprise a control substrate for supplying power to the detecting substrate and for outputting control signals according to the switching operation of the detecting switches. The control substrate may include a flashing circuit for outputting flash signals and may include a NE555 circuit as a control chip and/or an AC/DC rectifier.

An automatic test handler of the present invention may comprise stockers having loaded trays and empty trays. A tray transfer unit may include a transfer plate, detecting switches, a detecting substrate and a driving means. The transfer plate may include a plurality of tray holders for supporting the tray. The detecting switches may be positioned to correspond to each pocket of the tray and operated to detect a stack of semiconductor devices in any of the pockets.

The detecting substrate will typically include circuit wirings and an input/output terminal. The circuit wiring may be configured to connect the detecting switches in a parallel configuration with the input/output terminal connected to the circuit wires. The driving means may be operated to move the transfer plate. A tester is operated to electrically test the semiconductor devices received in the test tray.

A first chamber may be operated to establish one or more predetermined test temperature condition(s) for the semiconductor devices. A second chamber may be operated to restore the tested semiconductor devices to the normal temperature. A pick and place device may be included to transfer the semiconductor devices between trays. A control unit may be operated to control the stockers, the tester, the tray transfer units, the pick and place devices and the first and second chambers.

The detecting substrate and the detecting switches may be installed in the tray transfer unit. The control unit may output test stop signals according to the detecting signals received from the detecting substrate. The automatic test handler may also include an alarm means which operates in response to the detecting signals generated by the detecting substrate. The alarm means may include a warning lamp and/or buzzer. The automatic test handler may also include a control substrate for supplying power to the detecting substrate and outputting control signals for flashing a warning lamp according to operation of the detecting switch.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate like structural elements, and in which.

These drawings are representative of certain exemplary configurations of the invention and should not be construed as excluding alternative configurations, arrangements and materials. Similarly, the drawings are not to scale and the relative size and position of certain elements may have been modified to improve clarity.

DETAILED DESCRIPTION OF THE INVENTION

Exemplary embodiments of the present invention will be described below with reference to the accompanying drawings.

Referring to FIGS. 3 through 9, a tray transfer unit 100 comprises a transfer plate 110, detecting switches 130, a detecting substrate 140 and a driving unit including both a vertical driving unit 151 and a horizontal driving unit 161. The transfer plate 110 supports a tray containing semiconductor devices placed in an array of pockets provided on the tray. The driving units 151 and 161 may be utilized to transfer and position the transfer plate 110 relative to a tray that is intended for transfer.

Figure 5:
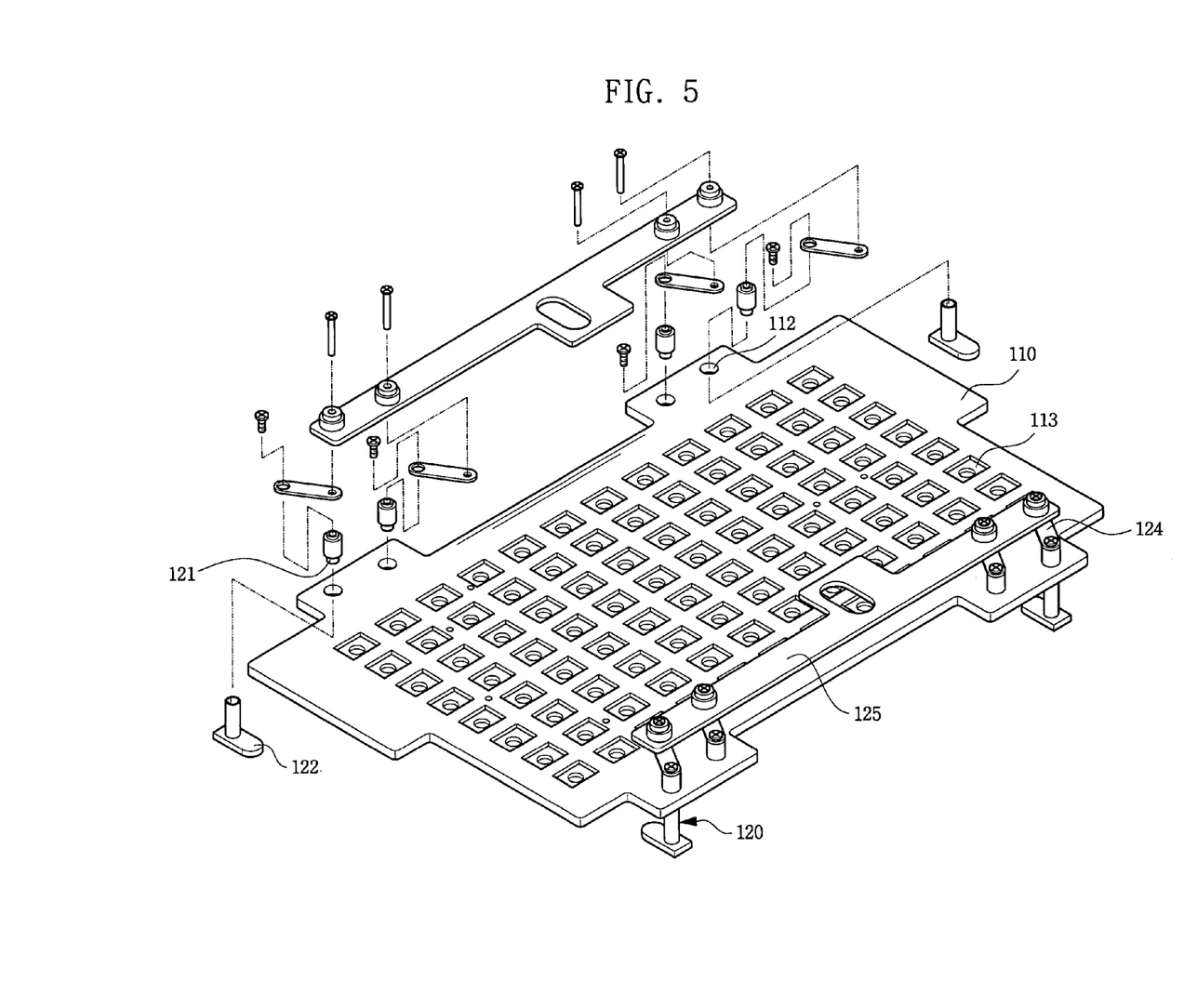
FIG. 5 is a partially exploded perspective view of the transfer plate of FIG. 4.

The transfer plate 110 has connection holes 112 located at the edges thereof, as shown in FIG. 5. Tray holders 120 are formed at the connection holes 112 for supporting the tray. A series of installation holes 113 are provided on the transfer plate 110 at locations corresponding to each pocket 25 of the tray 21 that will be transferred by the transfer plate. The installation holes 113 provided in the transfer plate 110 allow for the installation of detecting switches 130 as described in more detail below.

The tray holder 120 comprises rotation bearings 121, catch fingers 122, connection bars 124 and driving bars 125. The rotation bearings 121 or other rotatable members are rotatably inserted into the connection holes 112. The catch fingers 122 are fixed to the rotation bearings 121 at the bottom portion of the transfer plate 110. The connection bars 124 are connected between the rotation bearings 121 and the driving bars 125. The installation holes 113 may be varied in size and shape depending on the type of the detecting switches 130 utilized. The installation holes 113 may be formed as a series of recesses having a predetermined size and depth with a penetrating hole provided in each recess.

Figure 4:
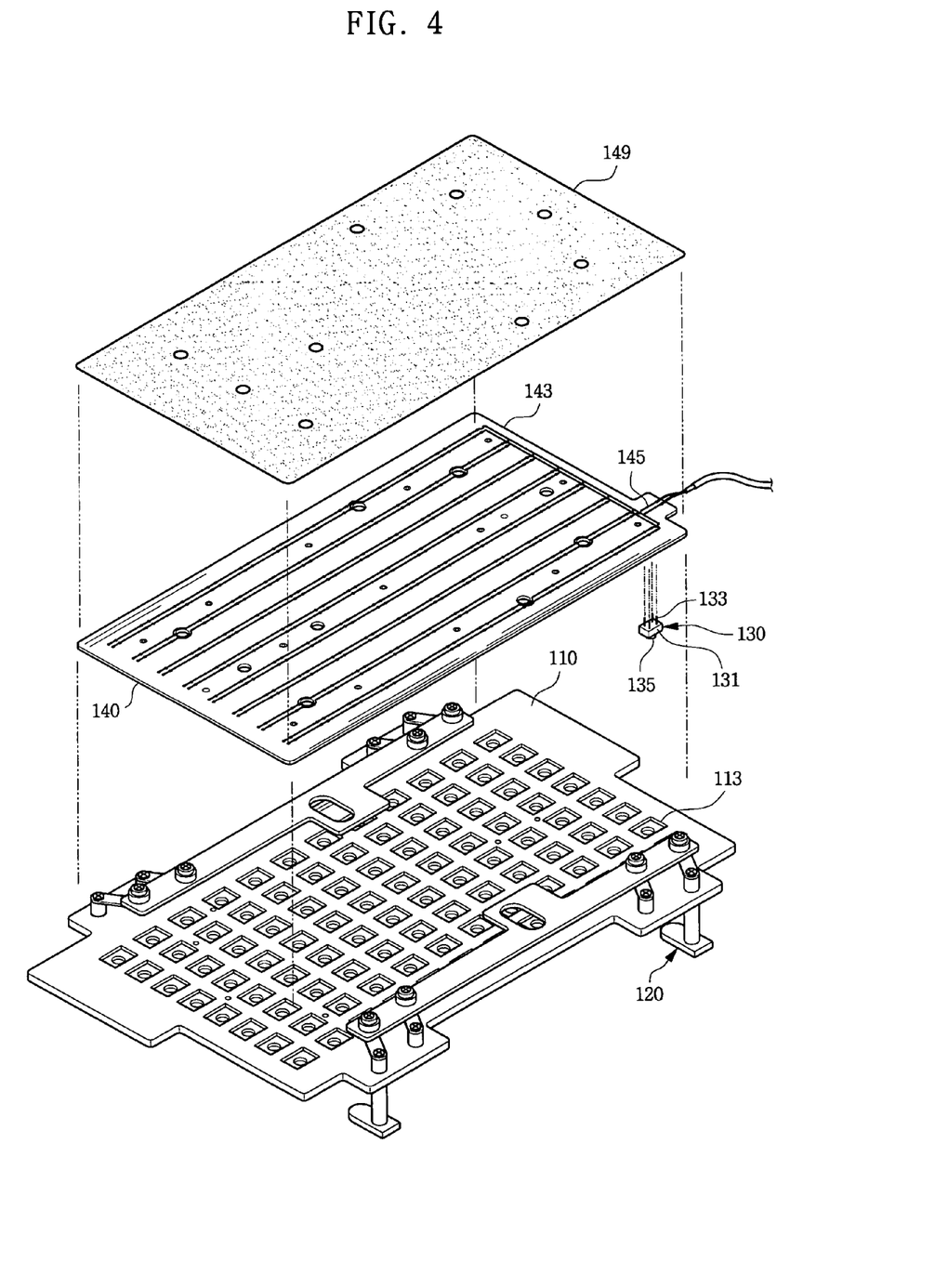
FIG. 4 is an exploded perspective view of a transfer plate, a detecting switch and a detecting substrate of FIG. 3.
Figure 6:
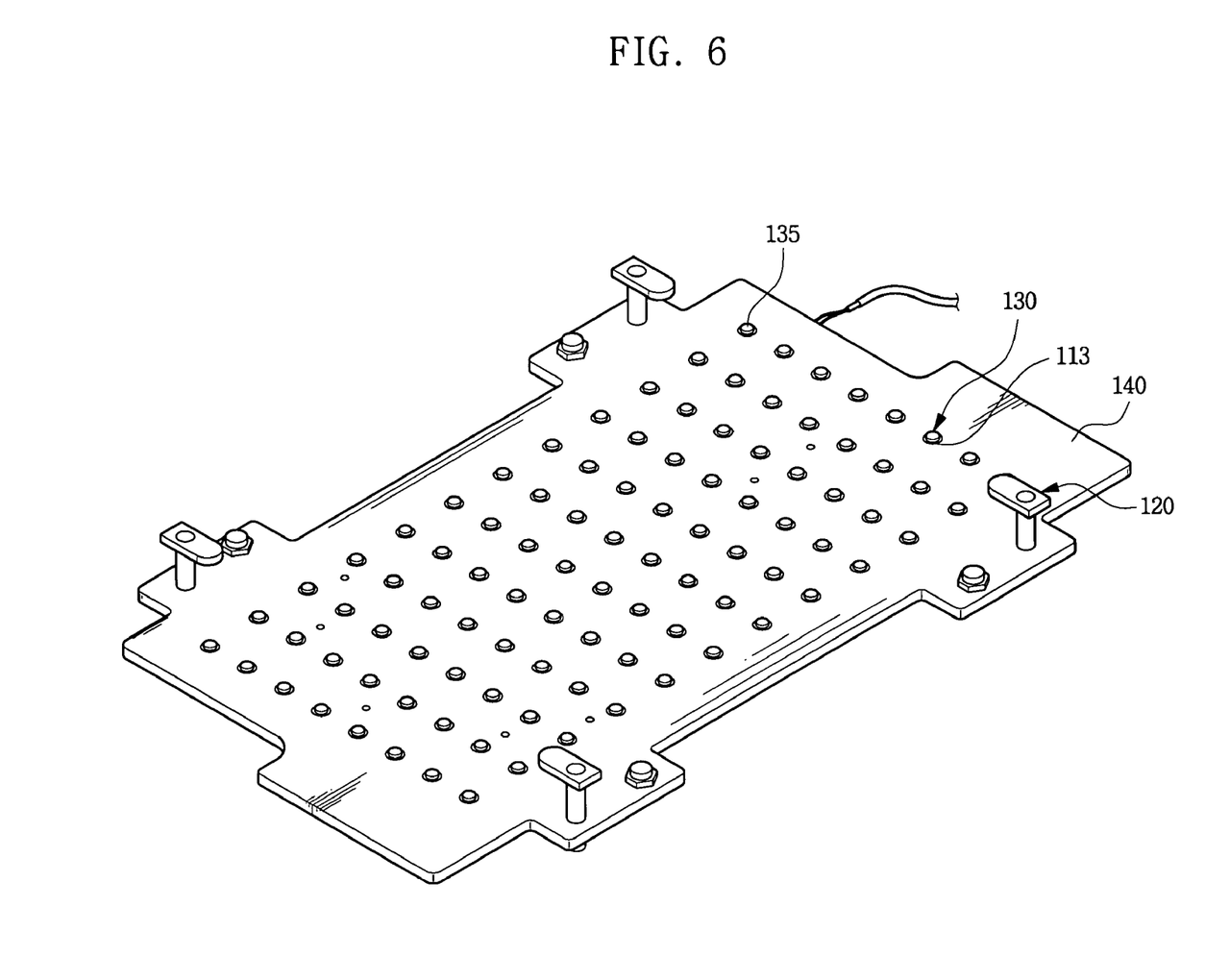
FIG. 6 is a bottom perspective view of the transfer plate of FIG. 4 with a portion of the detecting switches protruding through the installation holes.
Figure 7:
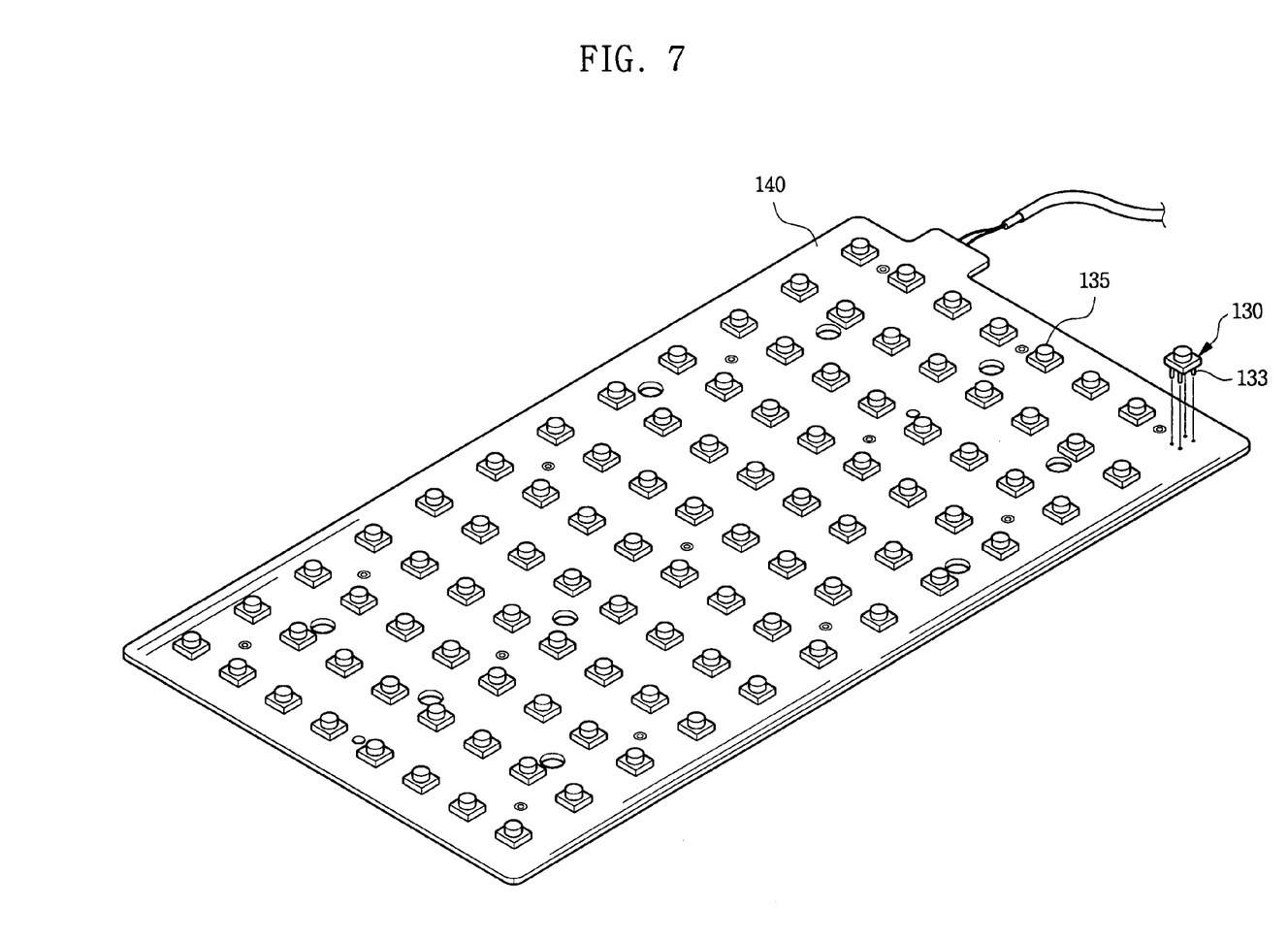
FIG. 7 is a bottom perspective view illustrating the connection of the detecting switches to the detecting substrate of FIG. 4.

The detecting switches 130 may be inserted as detecting means through the installation hole 113 of the transfer plate 110, as shown in FIGS. 4 and 6. The detecting switches 130 may be push-button switches having a mechanical contact mode. As illustrated in FIG. 4, the detecting switches 130 may have a switch body 131, which may be flexible, four leads 133 formed in one surface of the switch body 131 and a contact button 135 protruding from the surface opposite the leads. The leads 133 may be arranged internally in pairs that are electrically connected to each other when the contact button 135 is depressed and initiates a switching operation by the detecting switch 130.

Figure 9:
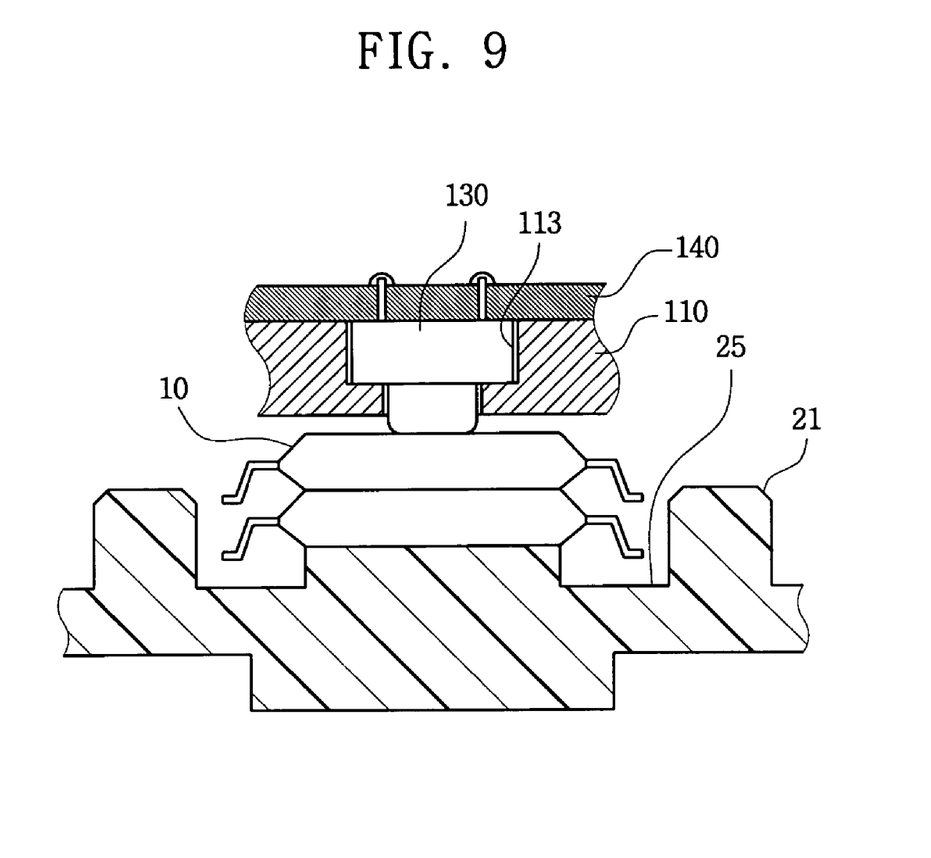
FIG. 9 is a partial cross-section view illustrating the operation of the detecting switch in accordance with an exemplary embodiment of the present invention.

Each of the contact buttons 135 typically protrudes a predetermined distance from the bottom of the transfer plate 110, as shown in FIGS. 6 and 9. The extent of protrusion is such that a contact button 135 is depressed when at least two semiconductor devices 10 are located in the corresponding pocket 25 of the tray 21 while the tray is supported against the transfer plate by the catch fingers 122 of the tray holders 120.

The detecting substrate 140 may be provided on and attached to the upper portion of the transfer plate 110. The detecting substrate 140 has the detecting switches 130 mounted in a configuration corresponding to the installation holes 113, each of which correspond to a pocket 25 of the tray 21. The leads 133 of the detecting switch 130 may be connected to the detecting substrate 140 by pin insertion into pin receptacles provided on the detecting substrate. The detecting substrate 140 may incorporate circuit wires 143 that connect the detecting switches 130 in a parallel configuration. An input/output terminal 145 for external connection may be connected to the circuit wires. A protection paper 149 or other protective covering may be provided on the upper portion of the detecting substrate 140 for protection from environmental or mechanical damage.

Figure 3:
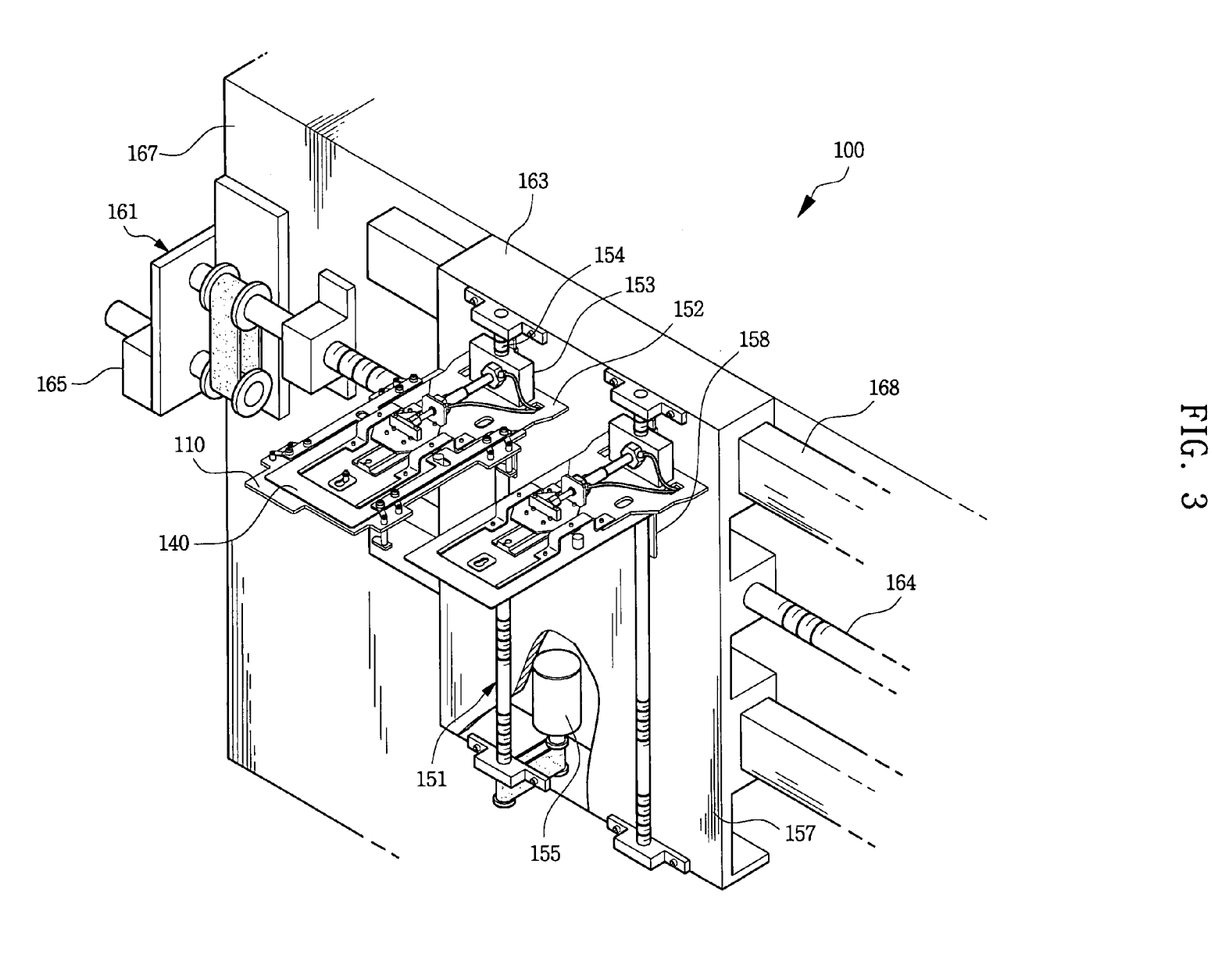
FIG. 3 is a perspective view of a tray transfer unit in accordance with an exemplary embodiment of the present invention.

The transfer plate 110 may be connected to the vertical driving unit 151 and the horizontal driving unit 161 to provide for vertical and horizontal movement. The vertical driving unit 151 comprises a fixing plate 152 to which the transfer plate 110 is fixed, a first bracket 153 connected to the fixing plate 152, a first screw 154 penetrating the first bracket 153 perpendicular to the ground and screw-connected to the first bracket 153, a first motor 155 transmitting rotary force to the first screw 154, a first base plate 157 to which the first screw 154 is fixed and a first guide rail 158 connected to the first bracket 153 for guiding the vertical movement of the transfer plate 110.

The horizontal driving unit 161 comprises a second bracket 163 to which the first base plate 157 is fixed, a second screw 164 penetrating the second bracket 163 parallel to the ground and screw-connected to the second bracket 163, a second motor 165 transmitting rotary force to the second screw 164, a second base plate 167 to which the second screw 164 is fixed and a second guide rail 168 guiding the horizontal movement of the transfer plate 110. The first and second motors 153 and 163 may be stepper motors.

Figure 8:
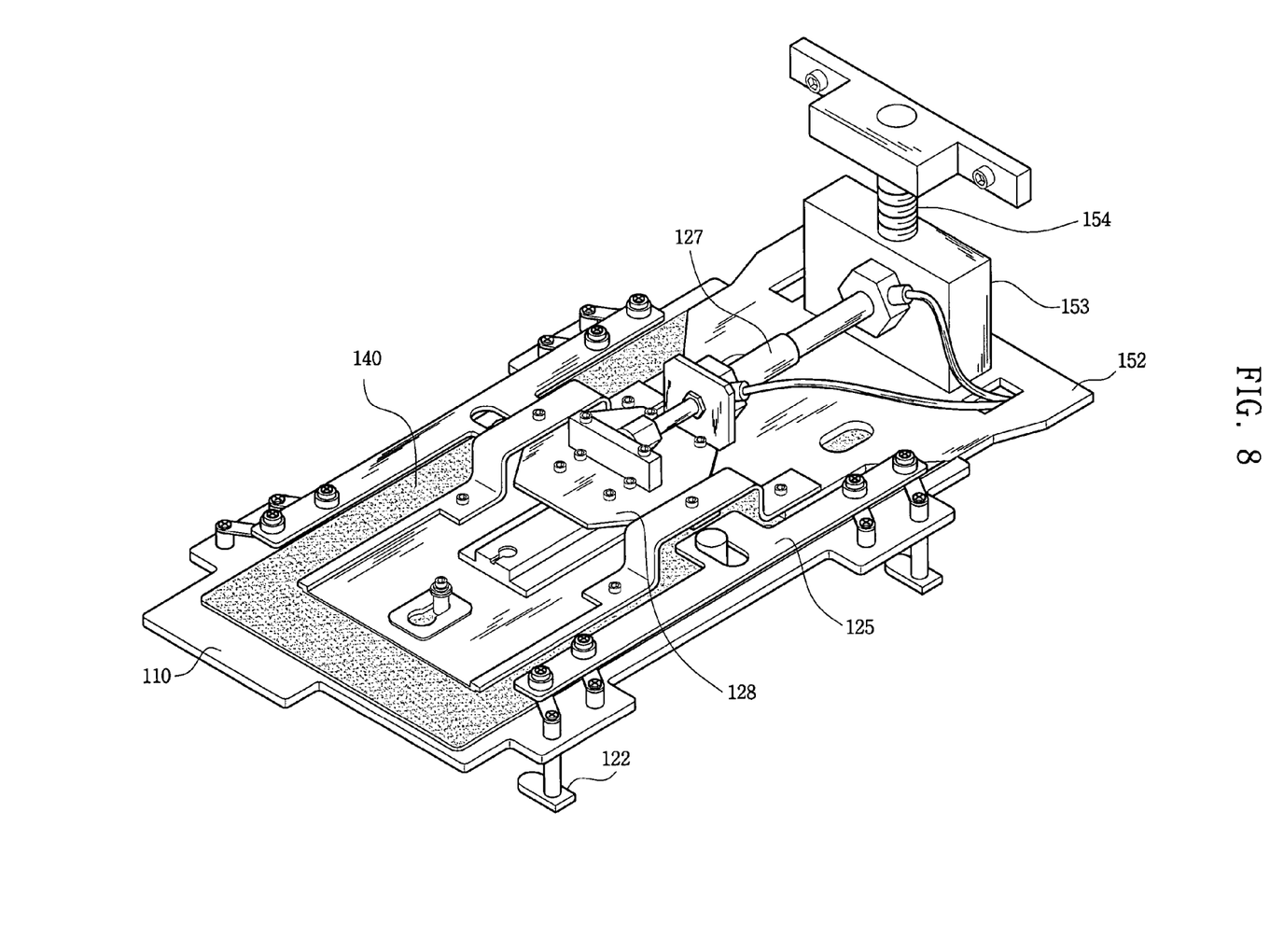
FIG. 8 is a perspective view of the connection of a transfer plate, a detecting substrate and a driving cylinder of FIG. 3.

Referring to FIG. 8, the fixing plate 152 has a catch finger driving cylinder 127 for moving the driving bar 125 of the transfer plate 110 forward or backward. The catch finger driving cylinder 127 transmits the driving force to the driving bar 125, the movement of the driving bar causing the catch finger 122 to rotate. The catch finger driving cylinder 127 may incorporate a pneumatic cylinder.

In operation, the horizontal driving unit 161 may be used to position the transfer plate 110 above a target tray 21. The vertical driving unit 151 may be used to lower the transfer plate 110 to a position adjacent a target tray 21. Then, the catch finger driving cylinder 127 drives the catch finger driving plate 128, which causes the driving bar 125 to move. The movement of the driving bar 125 causes the connection bar 124 to move, thereby rotating the rotation bearings 121 and the attached catch fingers 122 to support the bottom surface of the target tray 21.

Once the target tray 21 is secured to the transfer plate 110, the vertical driving unit 151 can be used to elevate the transfer plate 110 and the attached tray 21 and the horizontal driving unit 161 can be used to shift the transfer plate 110 to a desired horizontal position. Once in the desired horizontal position, the vertical driving unit 151 can be used to lower the transfer plate 110 to a desired vertical position, the catch finger driving cylinder 127 can be used to move the driving bar 125, thereby rotating the rotation bearings 121 and catch fingers 122 to release the tray 21.

If at least two semiconductor devices 10 are received in any one of the pockets 25 of the tray 21, the contact button 135 associated with such a pocket will be depressed and activate detecting switch 130. The resulting detecting signals are outputted through the input/output terminals 145 of the detecting substrate 140. Because the detecting switches 130 are arranged in a parallel configuration, when any one of the detecting switches 130 is activated, a detecting signal is generated. The detecting signal is transmitted to the control unit of the equipment incorporating the tray transfer unit 100 of the present invention. When a fault is detected, the control unit may stop the operation of the equipment and/or operate the alarm sound or lamp, allowing the operator to take prompt corrective measures.

As described above, the control unit of the equipment will preferably alert the operator if a fault is detected in the tray transfer unit. However, if it would be difficult to modify the equipment construction in this manner, a separate control substrate may be installed to trigger an alarm upon the detection of a double device fault and/or stop the operation of the equipment.

Figure 10:
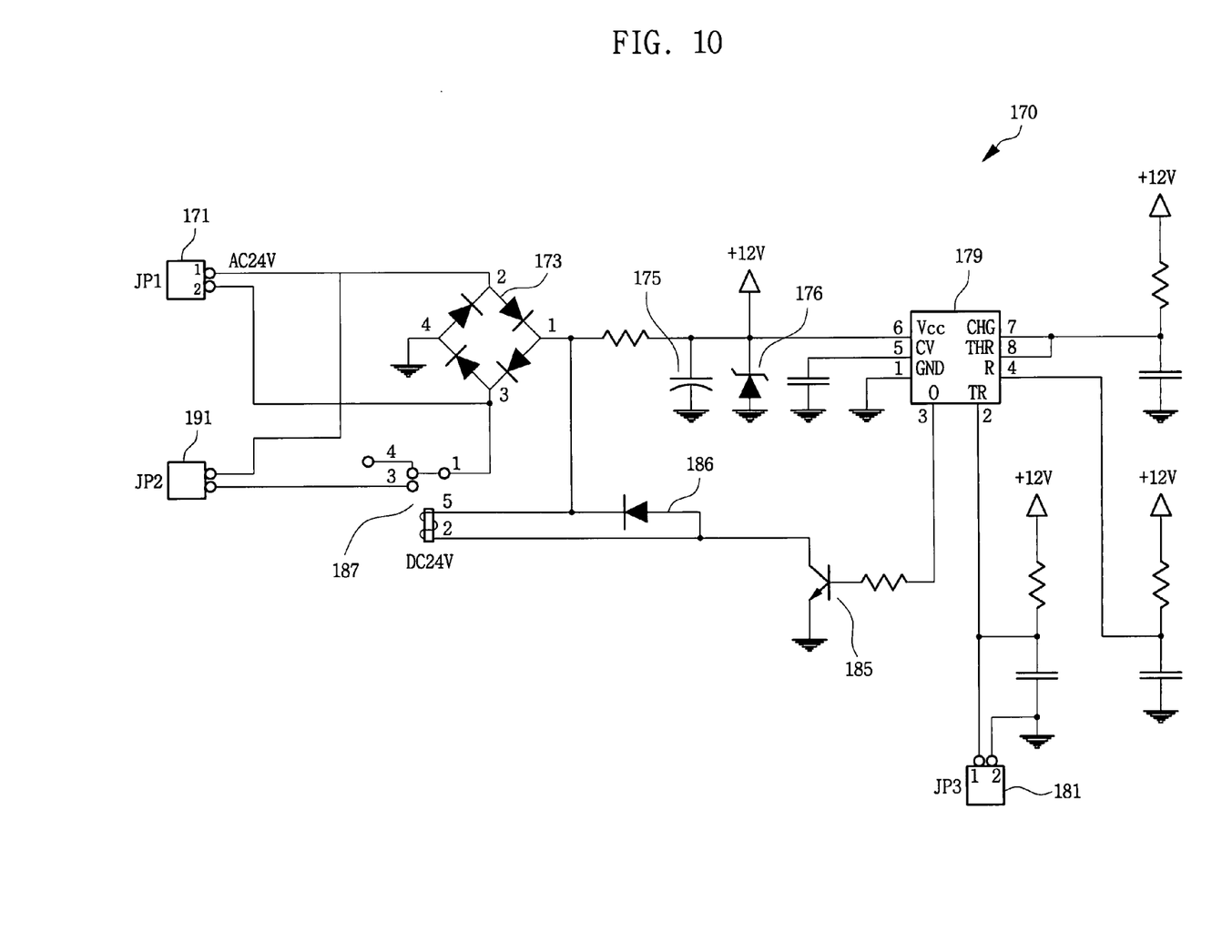
FIG. 10 is a circuit diagram view of a control substrate of the tray transfer unit in accordance with an exemplary embodiment of the present invention.

FIG. 10 is a circuit diagram view of an exemplary control substrate suitable for use in the tray transfer unit in accordance with an exemplary embodiment of the present invention. As illustrated in FIG. 10, the control substrate 170 includes a rectifier 173 for changing the alternating current input voltage of the detecting substrate (140 of FIG. 4) to direct current and a control chip 179 for generating alarm signals according to the input voltage from the rectifier 173.

The control substrate 170 is connected to the detecting substrate (140 of FIG. 4). A first terminal of a first connector 171 is connected to a second terminal of the rectifier 173. A second terminal of the first connector 171 is connected to a third terminal of the rectifier 173. The first terminal of the rectifier 173 is connected to a power terminal Vcc of a NE555 device which may be utilized as control chip 179. The rectifier 173 may comprise a bridge diode for converting the AC voltage provided from the first connector 171, e.g., an input alternating current voltage of 24V, to direct current.

The control chip 179 may be configured to generate periodic output signals. For example, the illustrated 8-pin NE555 device comprises one flip flop, one output transistor, two comparators and three resistors. A first pin is a ground terminal and a sixth pin is a power terminal. A second pin is a trigger, a third pin is an output terminal, a fourth pin is a reset terminal, a fifth pin is a control voltage terminal, a eighth pin is a threshold terminal and a seventh pin a discharge terminal. The sixth pin, Vcc, is disconnected from the seventh pin, CHG.

An electrolytic condenser 175 and a Zener diode 176 may be located between the rectifier 173 and the control chip 179. In such an arrangement, the electrolytic condenser 175 filters the input voltage to stabilize the voltage and the Zener diode 176 protects the control chip 179 from overvoltage conditions.

The trigger terminal (pin 2) of the control chip 179 may be connected to the third connector 181 and also to an alarm lamp line. The output terminal (pin 3) of the control chip 179 may be connected to the second terminal of a magnetic switch 187 through a PNP transistor 185. From the connection line after PNP transistor 185 the third output terminal diverges and is connected to both a fifth terminal of the magnetic switch 187 and the output of the rectifier 173 through a diode 186. The first terminal of the magnetic switch 187 is connected to the third terminal of the rectifier 173. The third terminal of the magnetic switch 187 is connected to the second terminal of the second connector 191. The first terminal of the second connector 191 is connected to the connection line of the first connector 171 and the rectifier 173. The second connector 191 is connected to the control line of the test handler. The magnetic switch 187 operates according to the output of the control chip 179 to control the control line of the test handler, consequently controlling the operation of the test handler.

When a double device fault is detected from the detecting substrate (140 of FIG. 4) by the control substrate 170, alternating current is input from the first connector 171, converted to direct current by rectifier 173, and then input into the control chip 179. The magnetic switch 187 operates according to the output of the control chip 179 to control the alarms and/or the test handler operation. Therefore, when a double device fault occurs, the alarm lamp flashes and/or the test handler stops so that the operator can take corrective measures. The control substrate 170 or its equivalent may be incorporated in the circuit substrate of the control unit of the test handler or may be provided as a separate control unit.

Figure 11:
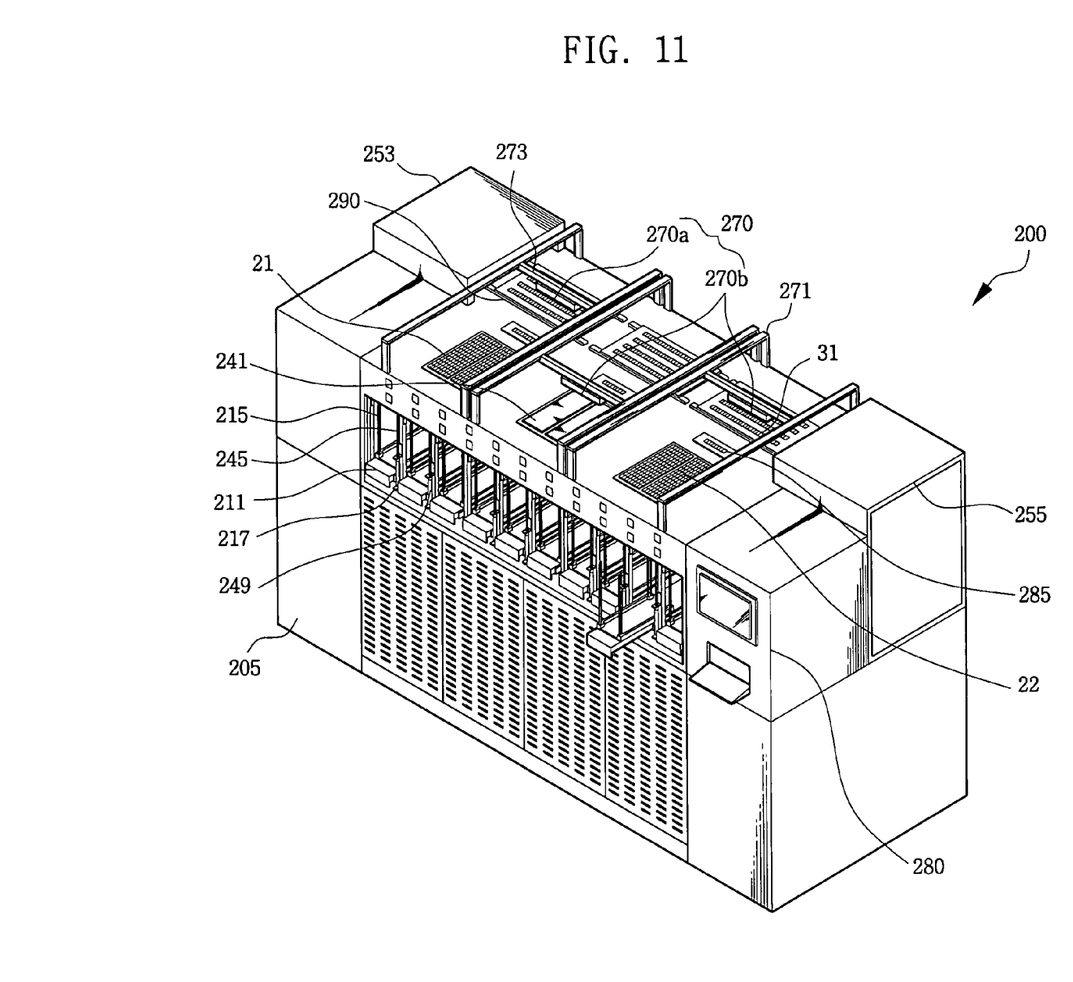
FIG. 11 is a perspective view of an automatic test handler in accordance with an exemplary embodiment of the present invention.
Figure 12:
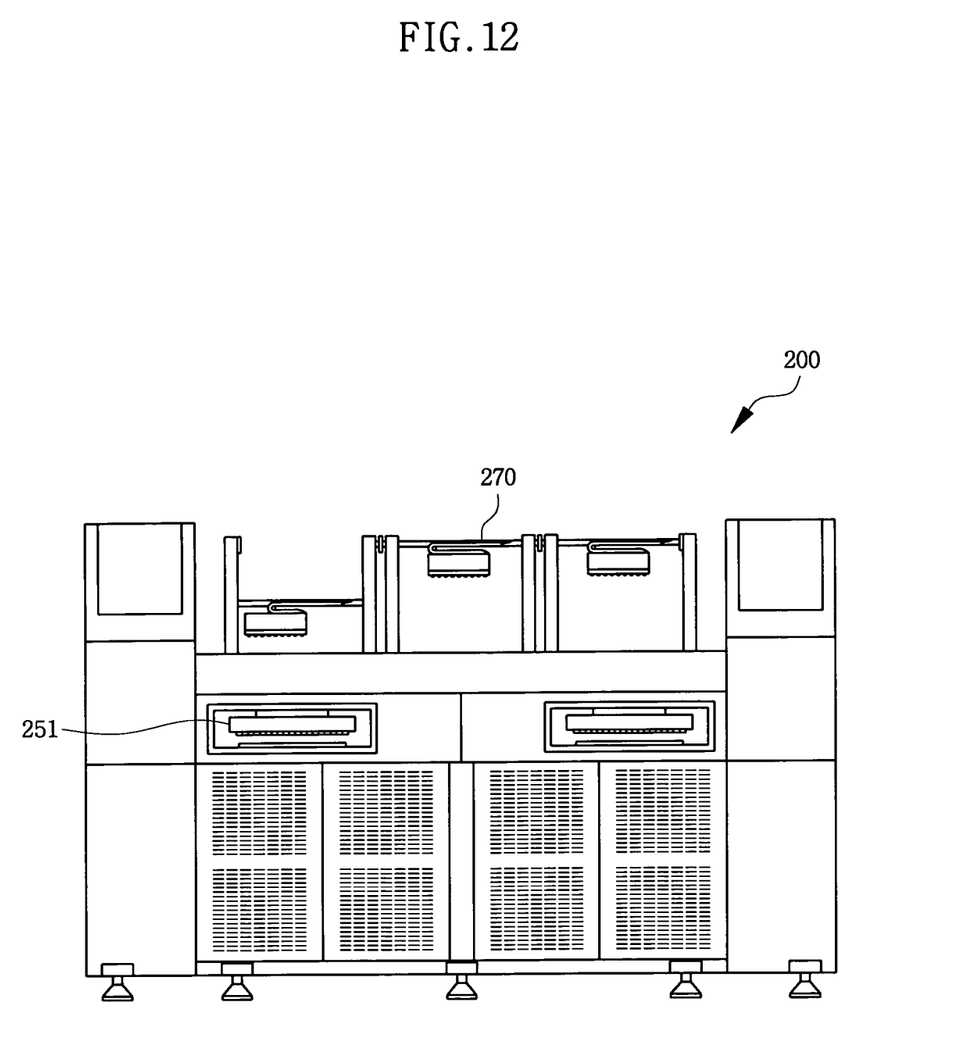
FIG. 12 is a rear view of the automatic test handler in accordance with an exemplary embodiment of the present invention.
Figure 13:
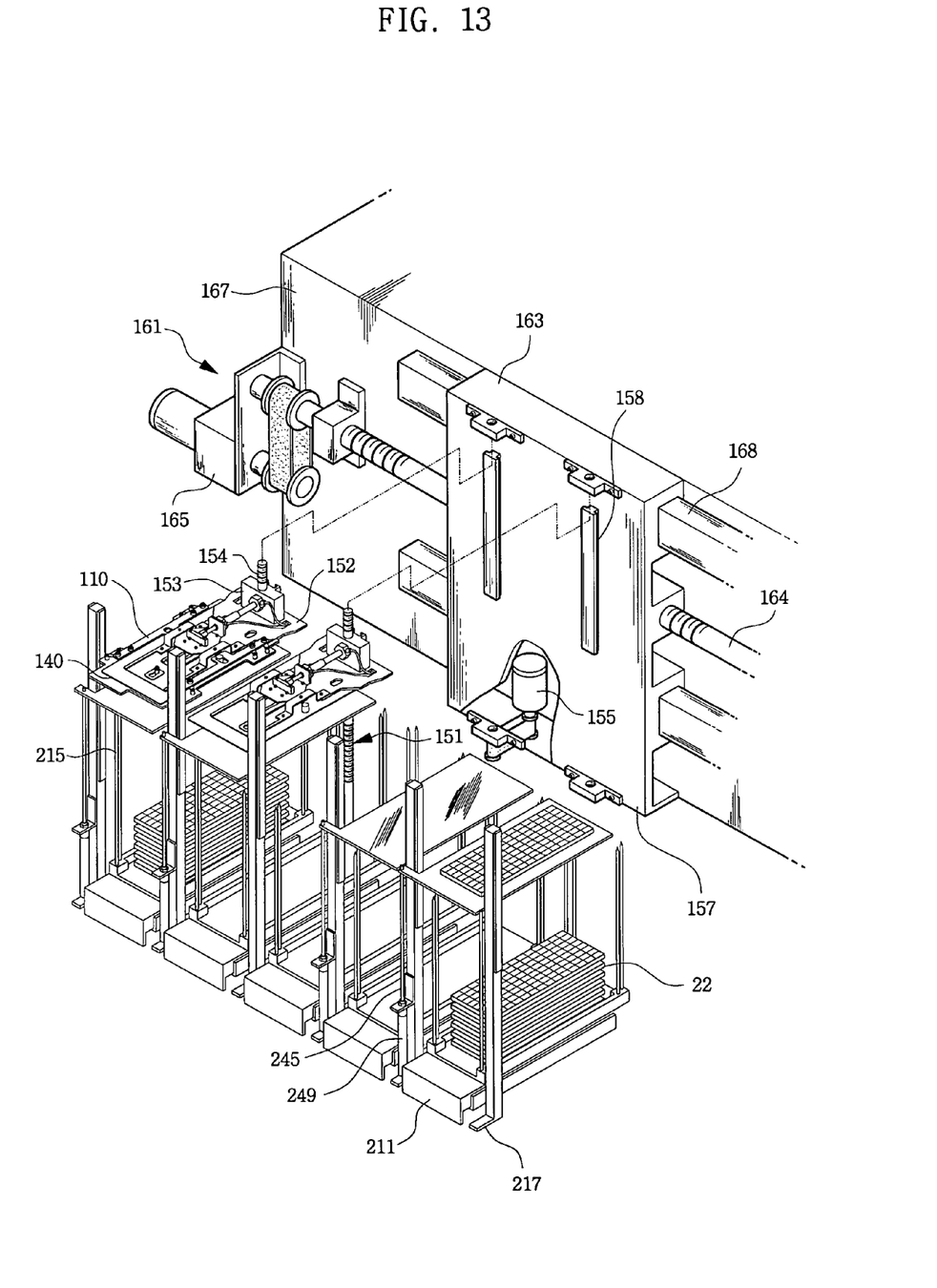
FIG. 13 is a perspective view of a tray stocker and a catch finger of the automatic test handler in accordance with an exemplary embodiment of the present invention.

FIG. 11 is a perspective view of an automatic test handler in accordance with an exemplary embodiment of the present invention. FIG. 12 is a rear view of the automatic test handler in accordance with an exemplary embodiment of the present invention. FIG. 13 is a perspective view of a tray stocker and a catch finger of the automatic test handler in accordance with an exemplary embodiment of the present invention.

Referring to FIGS. 11 through 13, an automatic test handler 200 comprises a tester 251 for testing semiconductor devices, a first chamber 253 for establishing the test temperature condition(s) for the semiconductor devices, a second chamber 255 for restoring the tested semiconductor devices to the normal temperature, a pick and place device 270 for transferring the semiconductor devices, a plurality of tray stockers 211 for receiving loaded trays 21 and empty trays 22 and grippers 241 for supporting the trays. The automatic test handler 200 further comprises a tray transfer unit 100 having a detecting substrate 140 for detecting the tray transfer and double device faults and a control unit 280 for controlling the overall operation.

The tray stocker 211 is installed on the upper portion of a cabinet 205. Vertical guide pins 215 are provided in the tray stocker 211 for maintaining the orientation of the tray 21 and guiding its vertical movement. The tray stocker 211 is divided by supports 217 and may include a moving means (not shown) for automatically moving the tray stocker forward and backward to simplify loading trays into the tray stocker. The supply, i.e., initially full, trays 21 containing semiconductor devices and receiving, i.e., initially empty, trays 22 may be loaded into the tray stocker 211 and an automatic test process initiated. After the test process has been completed, the receiving trays containing the sorted semiconductor devices may be removed from the tray stocker 211 and transferred to a subsequent processing step.

The tray transfer unit 100 may be installed on the upper portion of the tray stocker 211. As described above, the tray transfer unit 100 comprises a transfer plate 110, detecting switches 130 and a detecting substrate 140. The tray transfer unit 100 is connected to the control unit 280 to initiate an alarm in response to a double device fault and control the overall operation of the automatic test handler.

The tester 251 is installed on the upper portion of the cabinet 205. The tester 251 is connected to the semiconductor devices received in the test tray 31 to perform one or more electrical tests according to a predetermined series of input and output test signals. The first chamber 253 may be used to establish the temperature condition(s) for test, e.g., one or more temperatures between about −30° C. and 125° C. The second chamber 255 may be used to restore the tested semiconductor devices to approximately normal room temperature. The test tray 31 is conveyed by the conveyor belt(s) 290.

The pick and place device 270 may include both a loader pick and place device 270a and an unloader pick and place device 270b. The pick and place device 270 absorbs or "picks" the semiconductor devices from a supply tray by applying a vacuum to a surface of the semiconductor devices and lifting the semiconductor device from the pocket in which it was held. Once "picked" or removed from the supply tray, the semiconductor device may be moved to and deposited or "placed" in a pocket provided in a receiving tray, a test tray 31 or a buffer 285.

The pick and place device 270 may be configured to provide controlled movement in the x, y and z directions in order to provide the range of motion necessary to complete the desired transfers. As illustrated in FIGS. 11 and 12, the movement of the pick and place device 270 may be guided by a Y-axis support 271 and a X-axis support 273 to a position above a tray. Movement along a Z-axis, i.e., vertical, may then be initiated to position the absorbers in proximity to the pockets provided on the tray to remove semiconductor devices from or place semiconductor devices in the pockets according to the instructions received from the controller.

The gripper 241 is operated to support the tray 21 transferred by the tray transfer unit 100. An insertion portion 241a (not identified) is formed on the upper surface in the middle of the cabinet 205. The gripper moves upward and downward by a gripper moving means for insertion and detachment to/from the insertion portion 241a. The gripper moving means includes a guide rail 243 for guiding the gripper 241 and a pneumatic cylinder to which one end of a rod 245 is fixed.

A buffer 285 may be installed between the test tray 31 and the gripper 241 for temporarily holding the semiconductor devices. The buffer may be utilized to adjust the adsorption position of the semiconductor device during the transfer between the test tray 31 and the trays 21 and/or trays 22.

A control unit 280 is connected to at least the components related to loading/unloading and tray transfer operations and may be used to control the overall operation of the automatic test handler. For example, the control unit may be used to receive, store and/or evaluate the test data relating to semiconductor devices under test through a General Purpose Interface Bus (GPIB) and/or monitor and automatically control the temperature of the first chamber 253.

Although the exemplary embodiments of the present invention have been described in detail hereinabove, it should be understood that many variations and/or modifications of the basic inventive concepts herein taught, which may appear to those skilled in the art, will still fall within the spirit and scope of the present invention as defined in the appended claims.

What is claimed is:

1. A tray transfer apparatus, comprising:
a transfer plate, the transfer plate including
a plurality of tray holders arranged and configured for the selective support and release of a tray, the tray including an array of pockets for receiving semiconductor devices;
a detecting substrate including an array of detecting switches, the array of detecting switches arranged and configured to detect the presence of more than one semiconductor device in one of the pockets of a supported tray by contacting at least one of the semiconductor devices in one of the pockets;
wiring means connecting the detecting means to an input/output terminal; and
driving means arranged and configured for controlled vertical and horizontal movement of the transfer plate; and
a control substrate for generating a control signal, the control signal corresponding to an activation status of the detecting switches.

2. The tray transfer apparatus according to claim 1, wherein:
the detecting switches are mechanical contact type push-button switches, and
the detecting switches included in the array are connected in a parallel configuration.

3. The tray transfer apparatus according to claim 1, wherein:
the transfer plate includes a top surface, a bottom surfaces, and an array of installation holes extending through the transfer plate; and further wherein
the detecting switches extend through the installation holes and below a plane defined by the bottom surface of the transfer plate.

4. The tray transfer apparatus according to claim 3, wherein:
the detecting substrate has an upper surface and a lower surface,
the detecting switches are arranged on the lower surface of the detecting substrate; and
the detecting substrate is mounted on the top surface of the transfer plate, thereby extending the detecting switches through the installation holes.

5. The tray transfer apparatus according to claim 4, wherein:
the detecting switches are mounted on the lower surface of the detecting substrate by a method selected from soldering and friction fit.

6. The tray transfer apparatus according to claim 1, wherein:
the transfer plate includes a rotatable member arranged at a periphery of the transfer plate and extending above and below the transfer plate;
a catch finger connected to a lower extension of the rotatable member; and
an actuation means connected to an upper extension of the rotatable member, whereby the rotatable member may be selectively rotated to move the catch finger between a supporting position and a releasing position.

7. The tray transfer apparatus according to claim 1, wherein:
the control substrate further includes a flashing circuit arranged and configured to generate flash signals corresponding to the activation status of the detecting switches.

8. The tray transfer apparatus according to claim 7, wherein:
the flashing circuit includes a NE555 circuit.

9. The tray transfer apparatus according to claim 1, wherein:
the control substrate includes a direct current to alternating current rectifier.

10. An automatic test handler comprising:
a plurality of tray stockers arranged and configured for receiving and positioning trays, the trays including an array of pockets with each pocket being sized and configured to receive and hold a semiconductor device;
a tray transfer unit including a transfer plate arranged and configured to transfer and position a supported tray, and a detecting substrate including an array of detectors, the array of detectors arranged and configured to indicate the presence of more than one semiconductor device in a pocket of the supported tray by contacting at least one of the semiconductor devices in the pocket, and a driver;

a tester for performing electrical tests on the semiconductor devices;

a first chamber for establishing a first temperature condition in the semiconductor devices under which the semiconductor devices will be tested;

a second chamber for restoring the tested semiconductor device to the normal temperature;

a pick and place device arranged and configured for removing the semiconductor devices from the pockets and for placing the semiconductor devices into the pockets; and a controller for controlling the stockers, the tester, the tray transfer unit, the pick and place device and the first and second chambers; and a control substrate arranged and configured for providing power to the detecting substrate and for generating flash signals according to an activation status of the detectors.

11. The automatic test handler according to claim 10, wherein:

the controller is incorporated within the tray transfer unit.

12. The automatic test handler of claim 10, wherein:

the controller generates a test stop signal corresponding to the activation status of the detectors.

13. The automatic test handler according to claim 10, further comprising:

an alarm for generating an alarm signal corresponding to the activation status of the detectors.

* * * * *